US011805635B2

(12) United States Patent
Yamamoto et al.

(10) Patent No.: US 11,805,635 B2
(45) Date of Patent: Oct. 31, 2023

(54) SEMICONDUCTOR MEMORY DEVICE

(71) Applicant: Kioxia Corporation, Minato-ku (JP)

(72) Inventors: Hiroaki Yamamoto, Yokohama (JP); Shinichi Asou, Yokohama (JP); Kenichi Kawabata, Chigasaki (JP); Haruyuki Miyata, Ayase (JP); Takahiro Shimokawa, Yokohama (JP); Takaco Umezawa, Kamakura (JP); Syunsuke Sasaki, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 400 days.

(21) Appl. No.: 16/992,265

(22) Filed: Aug. 13, 2020

(65) Prior Publication Data

US 2021/0280587 A1    Sep. 9, 2021

(30) Foreign Application Priority Data

Mar. 5, 2020    (JP) .................. 2020-037481

(51) Int. Cl.
  *H10B 10/00*   (2023.01)
  *G11C 11/417*   (2006.01)
  *G11C 11/412*   (2006.01)

(52) U.S. Cl.
  CPC ............ *H10B 10/12* (2023.02); *G11C 11/412* (2013.01); *G11C 11/417* (2013.01); *H10B 10/18* (2023.02)

(58) Field of Classification Search
  CPC .......... H01L 27/11273–1128; H01L 27/11514; H01L 27/11551–11556; H01L 27/11578–11582; H01L 27/11597; H01L 27/2481–249; H01L 27/11286–11293; H01L 27/11526–11548; H01L 27/11573–11575
  See application file for complete search history.

(56) References Cited

U.S. PATENT DOCUMENTS

| | | | |
|---|---|---|---|
| 6,522,004 B1 * | 2/2003 | Higuchi | H01L 27/10897 257/209 |
| 7,928,517 B2 | 4/2011 | Tiemeijer | |
| 9,500,922 B2 | 11/2016 | Jiang et al. | |
| 10,461,750 B2 | 10/2019 | Hirashima et al. | |
| 2011/0079834 A1 | 4/2011 | Yanagisawa et al. | |

(Continued)

FOREIGN PATENT DOCUMENTS

| | | |
|---|---|---|
| JP | 2008-503892 A | 2/2008 |
| JP | 2011-082223 A | 4/2011 |

(Continued)

*Primary Examiner* — Amar Movva
(74) *Attorney, Agent, or Firm* — Oblon, McClelland, Maier & Neustadt, L.L.P.

(57) ABSTRACT

According to one embodiment, a semiconductor memory device includes, on a substrate, a memory region and a peripheral circuit region in which an MOS transistor is formed. The MOS transistor includes a drain region and a source region disposed in a first direction parallel to a surface of the substrate. On a surface of the drain region, a drain electrode is formed to be connected with a contact plug. Further, on a surface of the source region, a source electrode is formed to be connected with a contact plug. When viewed in the first direction, the drain electrode has a region that does not overlap with the source electrode, and the source electrode has a region that does not overlap with the drain electrode.

14 Claims, 11 Drawing Sheets

(56) References Cited

U.S. PATENT DOCUMENTS

| | | | |
|---|---|---|---|
| 2018/0053768 A1* | 2/2018 | Kim | ............... H01L 27/11575 |
| 2019/0067316 A1* | 2/2019 | Oh | ................. H01L 27/11568 |
| 2020/0014385 A1 | 1/2020 | Hirashima et al. | |
| 2020/0090741 A1 | 3/2020 | Suzuki | |

FOREIGN PATENT DOCUMENTS

| | | |
|---|---|---|
| JP | 2019-008859 A | 1/2019 |
| JP | 2020-047329 A | 3/2020 |
| TW | 543087 B | 7/2003 |
| TW | 201042759 A1 | 12/2010 |
| TW | 201803030 A | 1/2018 |

\* cited by examiner

SEMICONDUCTOR MEMORY DEVICE

CROSS-REFERENCE TO RELATED APPLICATIONS

This application is based upon and claims the benefit of priority from the prior Japanese Patent Application No. 2020-037481 filed on Mar. 5, 2020; the entire contents of which are incorporated herein by reference.

FIELD

Embodiments described herein relate generally to a semiconductor memory device.

BACKGROUND

A NAND flash memory is known as a type of a semiconductor memory device.

DETAILED DESCRIPTION

According to one embodiment, a semiconductor memory device includes: a memory region on a semiconductor substrate, in which a memory cell array is formed; and a peripheral circuit region on the semiconductor substrate, in which a peripheral circuit is formed, and the peripheral circuit region is formed with at least one MOS transistor. The MOS transistor includes a first diffusion layer and a second diffusion layer that are disposed with a predetermined interval in a first direction parallel to a surface of the semiconductor substrate, the MOS transistor further including at least one gate wiring disposed between the first diffusion layer and the second diffusion layer, the at least one gate extending in a second direction orthogonal to the first direction. A first contact region is formed on a surface of the first diffusion layer, the first contact region being connected with a first plug configured to electrically connect the first diffusion layer and a first wiring formed in a wiring layer located vertically above the semiconductor substrate. A second contact region is formed on a surface of the second diffusion layer, the second contact region being connected with a second plug configured to electrically connect the second diffusion layer and a second wiring formed in the wiring layer. When viewed in the first direction, the first contact region has a region that does not overlap with the second contact region, and the second contact region has a region that does not overlap with the first contact region.

Embodiments will be described below with reference to the drawings.

(1. Configuration)

(1-1. Configuration of Memory System)

Figure 1:
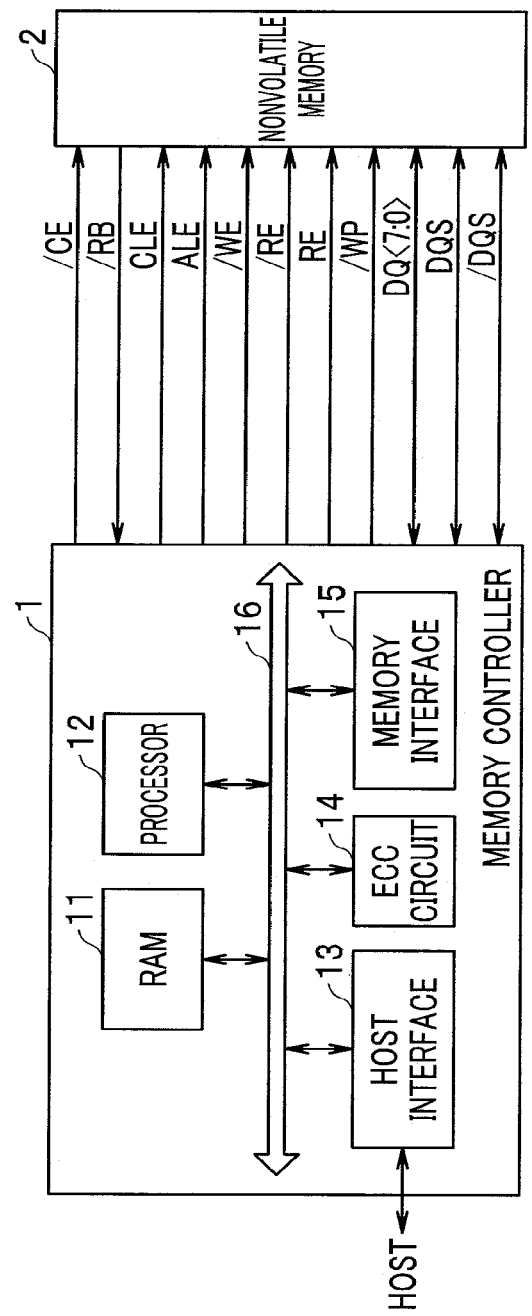
FIG. 1 is a block diagram showing a configuration example of a memory device according to an embodiment of the present invention.

FIG. 1 is a block diagram showing a configuration example of a memory system according to an embodiment of the present invention. The memory system of the present embodiment includes a memory controller 1 and a nonvolatile memory 2 as a semiconductor memory device. The memory system can be connected to a host. The host is, for example, an electronic device such as a personal computer, a portable terminal, or the like.

The nonvolatile memory 2 is a memory configured to store data in a nonvolatile manner, and includes, for example, a NAND memory (NAND flash memory). The nonvolatile memory 2 is, for example, a NAND memory having memory cells capable of storing 3 bits per memory cell, that is, a 3-bit/Cell (TLC: triple level cell) NAND memory. The nonvolatile memory 2 may be a 1-bit/Cell NAND memory, a 2-bit/Cell NAND memory, or a 4-bit/Cell NAND memory.

The memory controller 1 controls writing of data into the nonvolatile memory 2 according to a write request from the host. The memory controller 1 further controls reading of data from the nonvolatile memory 2 according to a read request from the host. Between the memory controller 1 and the nonvolatile memory 2, each of a chip enable signal/CE, a ready busy signal/RB, a command latch enable signal CLE, an address latch enable signal ALE, a write enable signal/WE, read enable signals RE and/RE, a write protect signal/WP, a data signal DQ<7:0>, and data strobe signals DQS and/DQS is transmitted and received.

For example, each of the nonvolatile memory 2 and the memory controller 1 is formed as a semiconductor chip (hereinafter, also simply referred to as "chip").

The chip enable signal/CE is a signal for enabling the nonvolatile memory 2. The ready busy signal/RB is a signal indicating whether the nonvolatile memory 2 is in a ready state (a state of accepting an instruction from the outside) or in a busy state (a state of not accepting an instruction from the outside). The command latch enable signal CLE is a signal indicating that a signal DQ<7:0> is a command. The address latch enable signal ALE is a signal indicating that the signal DQ<7:0> is an address. The write enable signal/WE is a signal for fetching the received signal into the nonvolatile memory 2, and is asserted every time a command, an address, and data are received by the memory controller 1. The nonvolatile memory 2 is instructed to fetch the signal DQ<7:0> while the signal/WE is at "L (low)" level.

The read enable signals RE and/RE are signals used for the memory controller 1 to read data from the nonvolatile memory 2. For example, the read enable signals RE and/RE are used to control an operation timing of the nonvolatile memory 2 during an output of the signal DQ<7:0>. The write protect signal/WP is a signal used to instruct the nonvolatile memory 2 to prohibit writing and erasing of data. The signal DQ<7:0> is an entity of data transmitted and received between the nonvolatile memory 2 and the memory controller 1, and includes a command, an address, and data. The data strobe signals DQS and/DQS are signals used to control an input/output timing of the signal DQ<7:0>.

The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another via an internal bus 16.

The host interface 13 outputs a request, user data (write data), and the like received from the host to the internal bus 16. The host interface 13 further transmits, to the host, user data read out from the nonvolatile memory 2 and a response from the processor 12.

The memory interface 15 controls, based on instructions from the processor 12, processing of writing user data or the like into the nonvolatile memory 2 and processing of reading user data or the like from the nonvolatile memory 2.

The processor 12 totally controls the memory controller 1. The processor 12 is, for example, a CPU (central processing unit) or an MPU (micro processing unit). When receiving a request from the host via the host interface 13, the processor 12 performs control according to the request. For example, the processor 12 instructs the memory interface 15 to write user data and a parity into the nonvolatile memory 2 according to a request from the host. The processor 12 further instructs the memory interface 15 to read user data and a parity from the nonvolatile memory 2 according to a request from the host.

The processor 12 determines a storage region (memory region) on the nonvolatile memory 2 for user data to be stored in the RAM 11. The user data are stored in the RAM 11 via the internal bus 16. The processor 12 determines the memory region for data in unit of a page (page data) which is unit of writing. In the specification, user data stored in one page of the nonvolatile memory 2 is defined as unit data. The unit data is generally encoded and stored as a codeword in the nonvolatile memory 2. In the present embodiment, encoding is not indispensable. Although the memory controller 1 may store the unit data in the nonvolatile memory 2 without encoding the unit data, FIG. 1 shows one configuration example of a configuration in which the unit data is encoded. When the memory controller 1 does not perform the encoding, the page data coincides with the unit data. One codeword may also be generated based on one unit data, or one codeword may be generated based on divided data into which the unit data is divided. Furthermore, one codeword may be generated by using plural unit data.

The processor 12 determines a memory region of the nonvolatile memory 2 as a write destination for each unit data. A physical address is allocated to a memory region of the nonvolatile memory 2. The processor 12 manages the memory region as the write destination for the unit data by using the physical address. The processor 12 designates the determined memory region (physical address) and instructs the memory interface 15 to write the user data into the nonvolatile memory 2. The processor 12 manages the correspondence between logical addresses of user data (logical addresses managed by the host) and physical addresses. When receiving a read request containing a logical address from the host, the processor 12 specifies the physical address corresponding to the logical address, designates the physical address, and instructs the memory interface 15 to read out user data.

The ECC circuit 14 encodes user data stored in the RAM 11 to generate a codeword. The ECC circuit 14 further decodes a codeword read out from the nonvolatile memory 2.

The RAM 11 temporarily stores user data received from the host until the user data have been stored in the nonvolatile memory 2 or temporarily stores data read out from the nonvolatile memory 2 until the data have been transmitted to the host. RAM 11 is a general-purpose memory such as an SRAM (static random access memory) or a DRAM (dynamic random access memory).

FIG. 1 shows a configuration example in which the memory controller 1 includes the ECC circuit 14 and the memory interface 15. However, the ECC circuit 14 may be incorporated in the memory interface 15. The ECC circuit 14 may be also incorporated in the nonvolatile memory 2.

When receiving a write request from the host, the memory system operates as follows. The processor 12 temporarily stores write-target data in the RANI 11. The processor 12 reads out the data stored in the RAM 11 and inputs the data to the ECC circuit 14. The ECC circuit 14 encodes the input data and inputs the codeword to the memory interface 15. The memory interface 15 writes the input codeword into the nonvolatile memory 2.

When receiving the read request from the host, the memory system operates as follows. The memory interface 15 inputs the codeword read out from the nonvolatile memory 2 to the ECC circuit 14. The ECC circuit 14 decodes the input codeword and stores the decoded data in the RAM 11. The processor 12 transmits the data stored in the RAM 11 to the host via the host interface 13.

(1-2. Configuration of Nonvolatile Memory)

Figure 2:
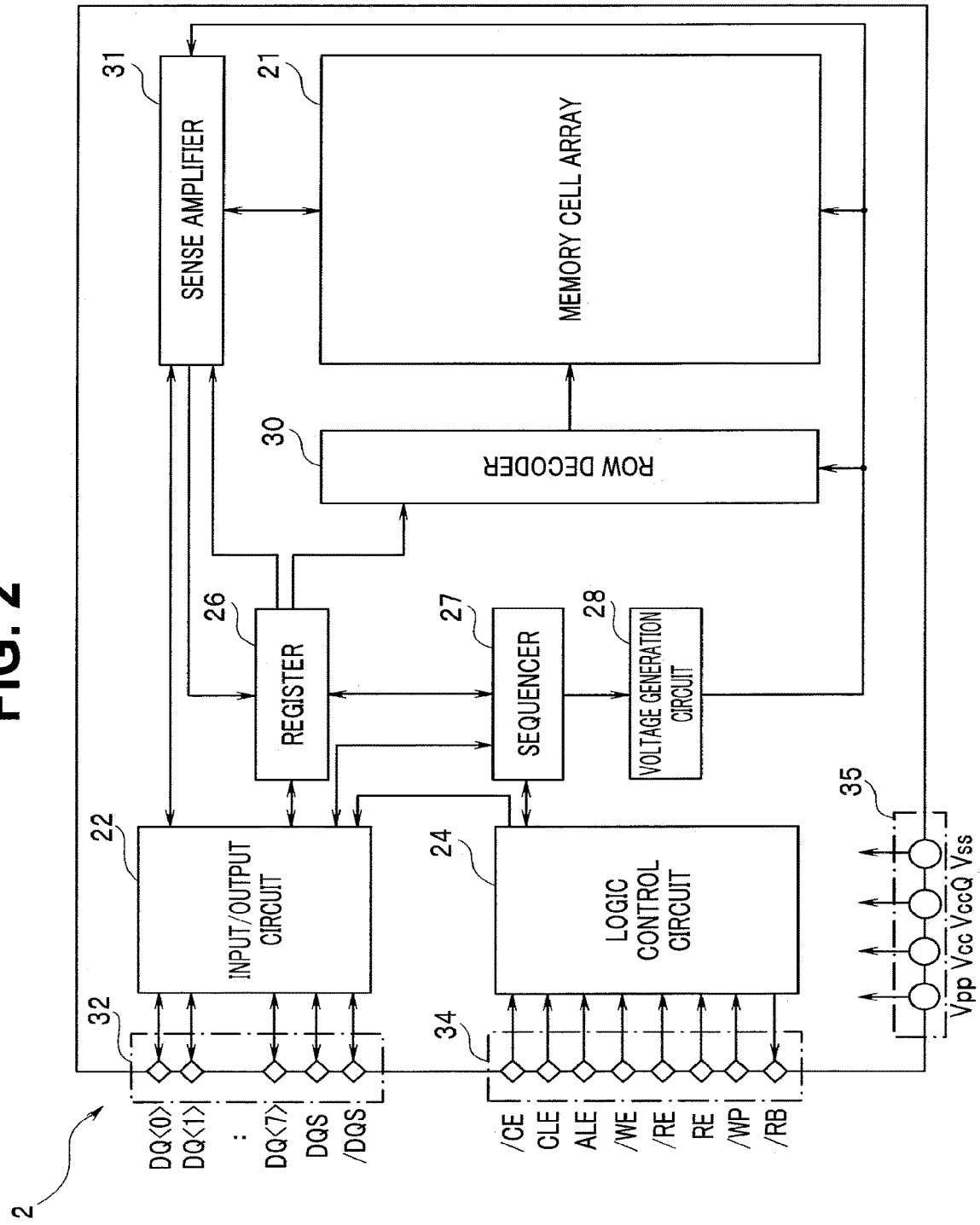
FIG. 2 is a block diagram showing a configuration example of a nonvolatile memory of the embodiment of the present invention.

FIG. 2 is a block diagram showing a configuration example of the nonvolatile memory of the present embodiment. The nonvolatile memory 2 includes a memory cell array 21, an input/output circuit 22, a logic control circuit 24, a register 26, a sequencer 27, a voltage generation circuit 28, a row decoder 30, a sense amplifier 31, an input/output pad group 32, a logic control pad group 34, and a power source inputting terminal group 35. The above-described circuits configuring the nonvolatile memory 2 are generally classified into two circuits of a memory circuit and a peripheral circuit. The memory circuit includes the memory cell array 21, the row decoder 30, and the sense amplifier 31. The peripheral circuit includes respective circuits of the input/output circuit 22, the logic control circuit 24, the register 26, the sequencer 27, the voltage generation circuit 28, the input/output pad group 32, the logic control pad group 34, and the power source inputting terminal group 35.

The memory cell array 21 includes a plurality of nonvolatile memory cells (not shown) associated with word lines and bit lines.

The input/output circuit 22 transmits and receives the signal DQ<7:0> and the data strobe signals DQS and/DQS to and from the memory controller 1. The input/output circuit 22 transfers a command and an address in the signal DQ<7:0> to the register 26. The input/output circuit 22 transmits and receives write data and read data to and from the sense amplifier 31.

The logic control circuit 24 receives the chip enable signal/CE, the command latch enable signal CLE, the address latch enable signal ALE, the write enable signal AVE, the read enable signals RE and/RE, and the write protect signal/WP from the memory controller 1. The logic control circuit 24 further transfers the ready busy signal/RB to the memory controller 1 and notifies the state of the nonvolatile memory 2 to the outside.

The voltage generation circuit 28 generates voltages required for operations such as writing, reading, and erasing of data based on an instruction from the sequencer 27.

The row decoder 30 receives a block address and a row address, among addresses, from the register 26, selects a corresponding block based on the block address, and selects a corresponding word line based on the row address.

At the time of the reading of data, the sense amplifier 31 senses read data that is read from the memory cells to the bit lines, and transfers the sensed read data to the input/output circuit 22. At the time of the writing of data, the sense amplifier 31 transfers write data to be written via the bit lines to the memory cells.

The input/output pad group 32 includes a plurality of terminals (pads) corresponding to the signal DQ<7:0> and the data strobe signals DQS and/DQS in order to transmit and receive respective signals including data to and from the memory controller 1.

The logic control pad group 34 includes a plurality of terminals (pads) corresponding to the chip enable signal/CE, the command latch enable signal CLE, the address latch enable signal ALE, the write enable signal/WE, the read enable signals RE and/RE, and the write protect signal/WP, in order to transmit and receive respective signals to and from the memory controller 1.

The power source inputting terminal group 35 includes a plurality of terminals configured to input power source voltages Vcc, VccQ, and Vpp and a ground voltage Vss, in order to supply various operating power sources to the nonvolatile memory 2 from the outside. The power source voltage Vcc is a circuit power source voltage generally given from the outside as an operating power source, and for example, a voltage of about 3.3 V is input. For example, a voltage of 1.2 V is input as the power source voltage VccQ. The power source voltage VccQ is used when signals are transmitted and received between the memory controller 1 and the nonvolatile memory 2. The power source voltage Vpp is a power source voltage higher than the power source voltage Vcc, and for example, a voltage of 12 V is input. A high voltage of about 20 V is required for writing data or erasing data to and from the memory cell array 21. At this time, a desired voltage can be generated at high speed and with low power consumption in a case of boosting the power source voltage Vpp of about 12 V rather than a case of boosting the power source voltage Vcc of about 3.3 V using a booster circuit of the voltage generation circuit 28. On the other hand, for example, when the nonvolatile memory 2 is used in an environment in which a high voltage cannot be supplied, the power source voltage Vpp may not be supplied with a voltage. Even when the power source voltage Vpp is not supplied, the nonvolatile memory 2 can execute various operations as long as the power source voltage Vcc is supplied. In other words, the power source voltage Vcc is a power source normally to be supplied to the nonvolatile memory 2, and the power source voltage Vpp is a power source additionally and arbitrarily to be supplied according to a use environment, for example.

(1-3. Configuration of Peripheral Circuit)

Figure 3:
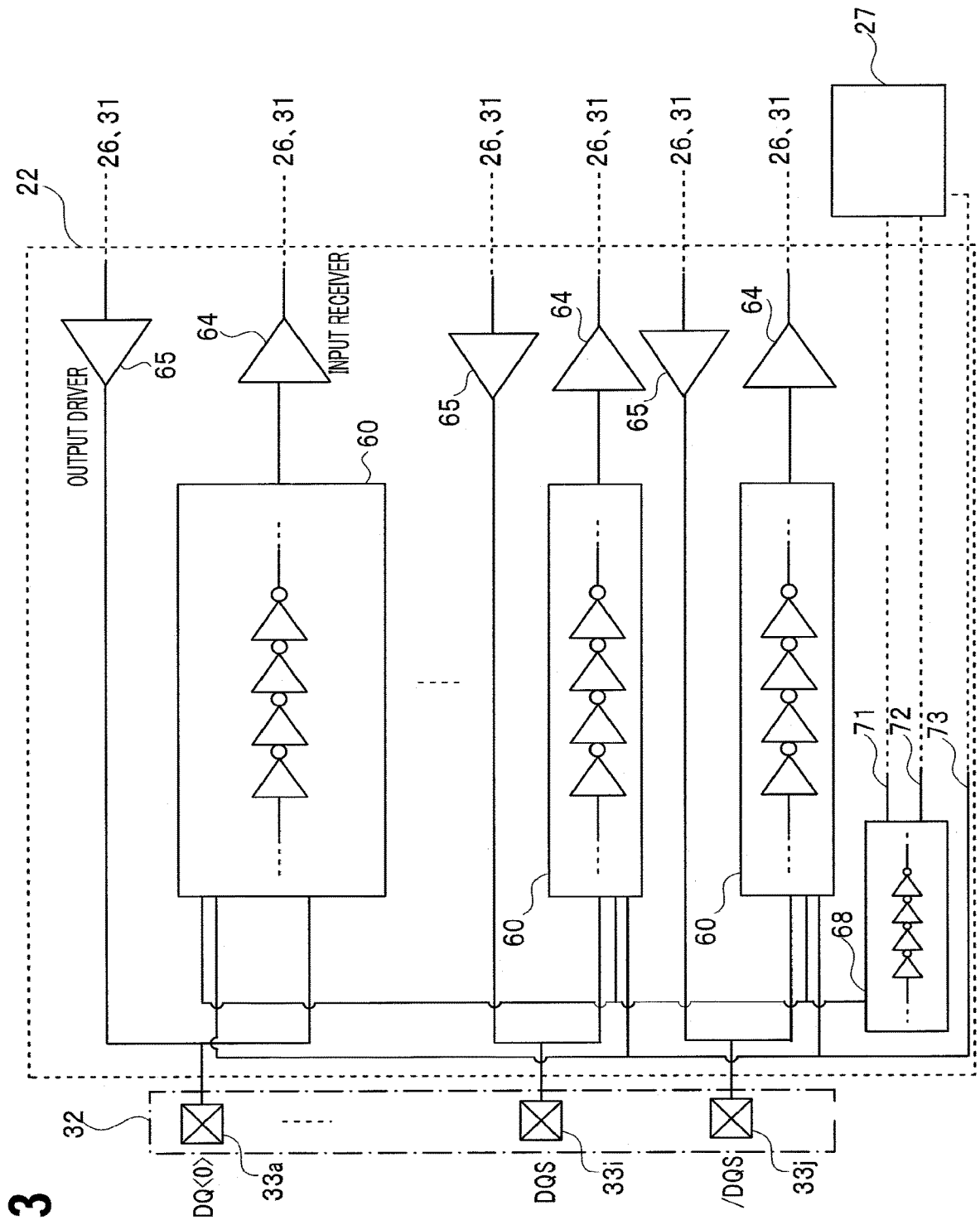
FIG. 3 is a circuit diagram schematically showing a connection between input/output terminals and input/output circuits.

A configuration of the input/output circuit 22 will be described as an example of the peripheral circuit. FIG. 3 is a circuit diagram schematically showing a connection between input/output terminals and input/output circuits. As shown in FIG. 3, the input/output circuit 22 includes, for each corresponding terminal (pad), an ODT (on die termination) circuit 60, an input circuit configured by an input receiver 64, and an output circuit configured by an output driver 65.

The input receiver 64 functions, for example, as a buffer, converts a signal input from the memory controller 1 into, for example, a voltage-level signal appropriate for processing in the nonvolatile memory 2, and transfers the signal to other circuits in the nonvolatile memory 2 including the memory cell array 21.

The output driver 65 functions, for example, as a butter, converts the signal transferred from the memory cell array 21 into an appropriate voltage-level signal, and outputs the resulting signal to the memory controller 1. The output driver 65 is also called an OCD (off chip driver), and is configured, for example, by disposing a p-type MOS transistor (PMOS transistor) and an NMOS transistor in series between a terminal to which the power source voltage VccQ is input and a terminal to which the ground voltage Vss is input.

The ODT circuit 60 functions as a terminating resistance circuit. The ODT circuit 60 is provided between each of the pads 33 of the input/output pad group 32 and the input receiver 64. The ODT circuit 60 is configured, for example, by combining logic gates such as inverters in multiple stages. The ODT circuit 60 is connected to a decoder 68 as a decoding circuit. The decoder 68 is also configured, for example, by combining logic gates such as inverters in multiple stages. An ODT resistance value setting signal line 71 and a process trimming signal line 72 are connected to the decoder 68 from an ODT control circuit (not shown). The decoder 68 generates an ODT control signal based on the signals input from the ODT resistance value setting signal line 71 and the process trimming signal line 72, and outputs the ODT control signal to each of the ODT circuits 60. Each of the ODT circuits 60 is connected with an ODT enable signal line 73 that transmits an on/off control signal.

(1-4. Three-Dimensional Configuration of Memory cell array and Peripheral circuit)

Figure 4:
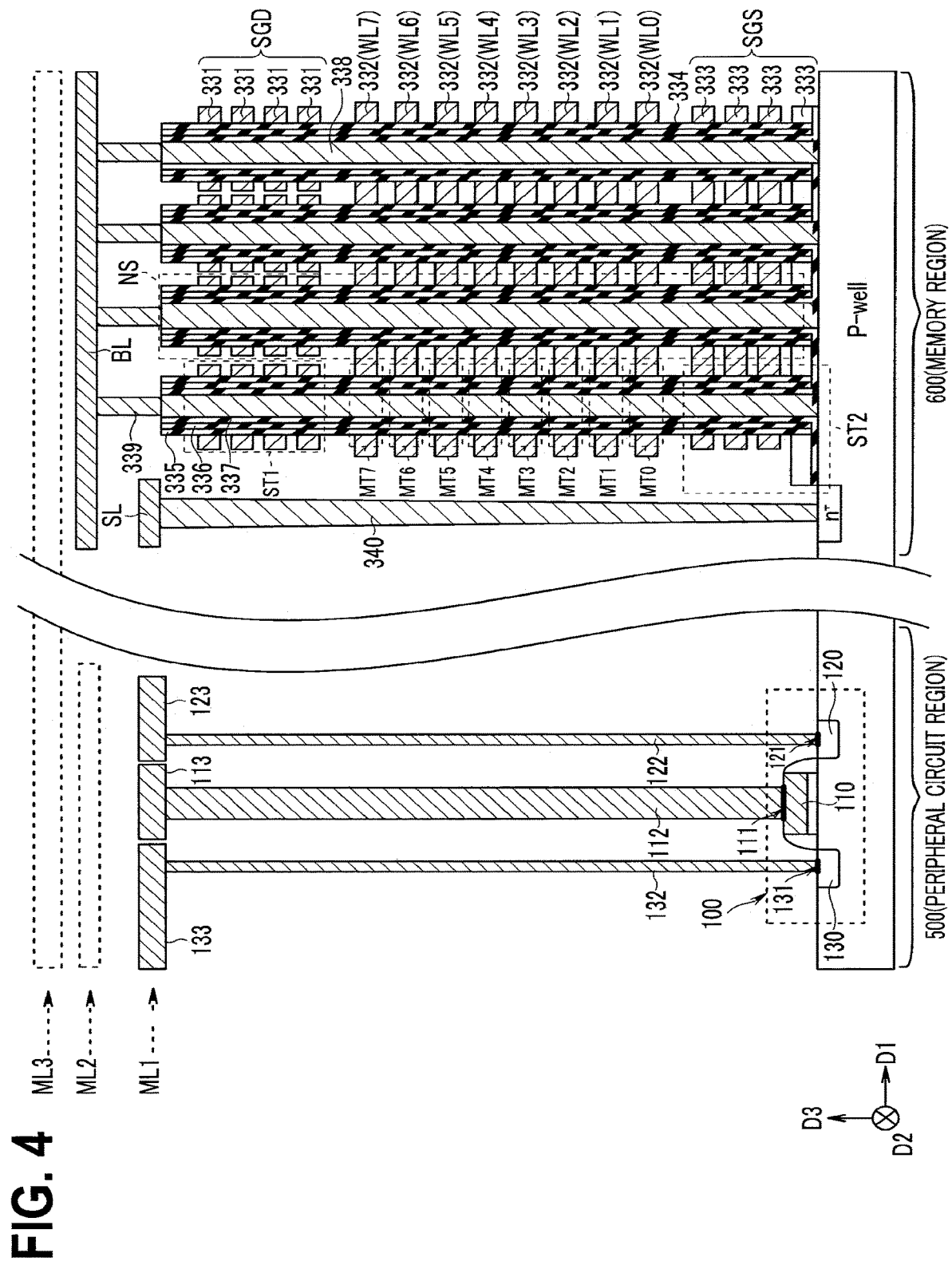
FIG. 4 is a cross-sectional view of a partial region of a memory cell array and a peripheral circuit of a NAND memory having a three-dimensional structure.

FIG. 4 is a cross-sectional view of a partial region of a memory cell array and a peripheral circuit of a NAND memory having a three-dimensional structure. In the following description, an extending direction of a bit line BL on a plane parallel to a semiconductor substrate surface is defined as D1. A direction parallel to the semiconductor substrate surface or orthogonal to D1 is defined as D2. A direction orthogonal to the semiconductor substrate surface is defined as D3. In the present embodiment, a memory region 600, in which the memory circuit is formed, is provided on the semiconductor substrate, and a peripheral circuit region 500, in which the peripheral circuit is formed, is provided on the semiconductor substrate around the memory region 600. In other words, when viewed in the D3 direction, the memory region 600 and the peripheral circuit region 500 are disposed so as not to overlap each other.

The memory cell array 21 of the present embodiment disposed in the memory region 600 has a three-dimensional structure. Further, a semiconductor chip 2 is formed into one chip. In other words, the memory circuit including the memory cell array 21 and the peripheral circuit are formed on one chip, that is, on the same semiconductor substrate. As shown in FIG. 4, a plurality of NAND strings NS are formed on a p-type well region (P-well). In other words, a plurality of wiring layers 333 functioning as select gate lines SGS, a plurality of wiring layers 332 functioning as word lines WLi, and a plurality of wiring layers 331 functioning as select gate lines SGD are stacked on the p-type well region. FIG. 4 shows a structure in which eight wiring layers 332 functioning as word lines WLi are stacked, but in recent years, a NAND string NS has been used in which wiring layers 332 having more multilayers such as 48 layers, 64 layers, and 96 layers are stacked.

A memory hole 334 that penetrates these wiring layers 333, 332, and 331 and reaches the p-type well region is formed. On a side surface of the memory hole 334, a block insulating film 335, a charge storage layer 336, and a gate insulating film 337 are sequentially formed, and a conductor pillar 338 is further embedded in the memory hole 334. The conductor pillar 338 is made of, for example, polysilicon, and functions as a region where a channel is formed when memory cell transistors MT and select transistors ST1 and ST2 included in the NAND string NS operate.

In each of the NAND strings NS, a select transistor ST2, a plurality of memory cell transistors MT, and a select transistor ST1 are formed on the p-type well region. A wiring layer functioning as a bit line BL is formed above the conductor pillar 338. A contact plug 339 is formed on an upper end of the conductor pillar 338 to connect the conductor pillar 338 and the bit line BL.

Further, an n+-type impurity diffusion layer and a p+-type impurity diffusion layer are formed in the surface of the p-type well region. A contact plug 340 is formed on the n+-type impurity diffusion layer, and a wiring layer functioning as a source line SL is formed on the contact plug 340.

A plurality of the configurations shown in FIG. 4 are arranged in a depth direction (D2 direction) of the paper surface of FIG. 4, and one string unit SU is formed by a set of a plurality of NAND strings arranged in the depth direction.

Each of the circuits included in the peripheral circuit, for example, the input/output circuit 22 is formed in the peripheral circuit region 500. For example, the input/output circuit 22 described above has a configuration in which logic gates such as inverters are combined in multiple stages. Therefore, a large number of MOS transistors configuring logic gates are formed in the peripheral circuit region 500. Such a large number of MOS transistors are formed on the semiconductor substrate in the peripheral circuit region 500. FIG. 4 shows one of such MOS transistors. Note that FIG. 4 schematically shows a cross-sectional structure of the nonvolatile memory 2, and a size of the MOS transistor 100 shown in FIG. 4 and a ratio between components configuring the MOS transistor 100 are different from the actual size and ratio.

In the MOS transistor 100 configuring the peripheral circuit, a gate wiring 110 is formed on the semiconductor substrate via a gate insulating film. The gate wiring 110 is, for example, a polysilicon film into which impurities suitable for the operation of the MOS transistor are implanted. A drain region 120 and a source region 130 are formed in the semiconductor substrate on the right and left sides of the gate wiring 110 in the D1 direction, respectively. For example, when the MOS transistor 100 is an n-type MOS transistor (NMOS transistor), impurities such as arsenic (As) and phosphorus (P) are implanted into the semiconductor substrate in the drain region 120 and the source region 130, and are diffused to a predetermined depth.

A metal wiring 113 is formed above the gate wiring 110 to supply a potential to the gate wiring 110 via an insulating layer. A gate electrode 111 serving as a contact region is formed on the gate wiring 110. A contact plug 112 is formed on an upper side of the gate electrode 111 to electrically connect the metal wiring 113 and the gate electrode 111. In other words, a potential of the metal wiring 113 is supplied from the gate electrode 111 to the gate wiring 110 via the contact plug 112.

A metal wiring 123 is formed above the drain region 120 to supply a potential to the drain region 120 via an insulating layer. A drain electrode 121 serving as a contact region is formed on the drain region 120. A contact plug 122 is formed on an upper side of the drain electrode 121 to electrically connect the metal wiring 123 and the drain electrode 121. In other words, a potential of the metal wiring 123 is supplied from the drain electrode 121 to the drain region 120 via the contact plug 122.

A metal wiring 133 is formed above the source region 130 to supply a potential to the source region 130 via an insulating layer. A source electrode 131 serving as a contact region is formed on the source region 130. A contact plug 132 is formed on an upper side of the source electrode 131 to electrically connect the metal wiring 133 and the source electrode 131. In other words, a potential of the metal wiring 133 is supplied from the source electrode 131 to the source region 130 via the contact plug 132.

Like the bit line BL, the source line SL, and the metal wirings 131 to 133, the wiring layers formed of a metal material are formed above the NAND string after the NAND string NS is formed. In general, the wiring layers formed of the metal material are formed to have a plurality of layers with an insulating film interposed between the wiring layers. FIG. 4 shows an example in which three wiring layers ML1, ML2, and ML3 are provided. The bit line BL, the source line SL, and the metal wirings 131 to 133 are formed on one or more of such wiring layers. For example, FIG. 4 shows a case where the metal wirings 131 to 133 and the source line SL are formed on a wiring layer ML1 which is a bottommost layer and the bit line BL is formed on a wiring layer ML2 which is an intermediate layer from the bottom. Note that a wiring is formed on a wiring layer ML3 which is a topmost layer to transmit a power source voltage, for example.

(2. Layout)

(2-1. Layout of MOS Transistor)

Figure 5:
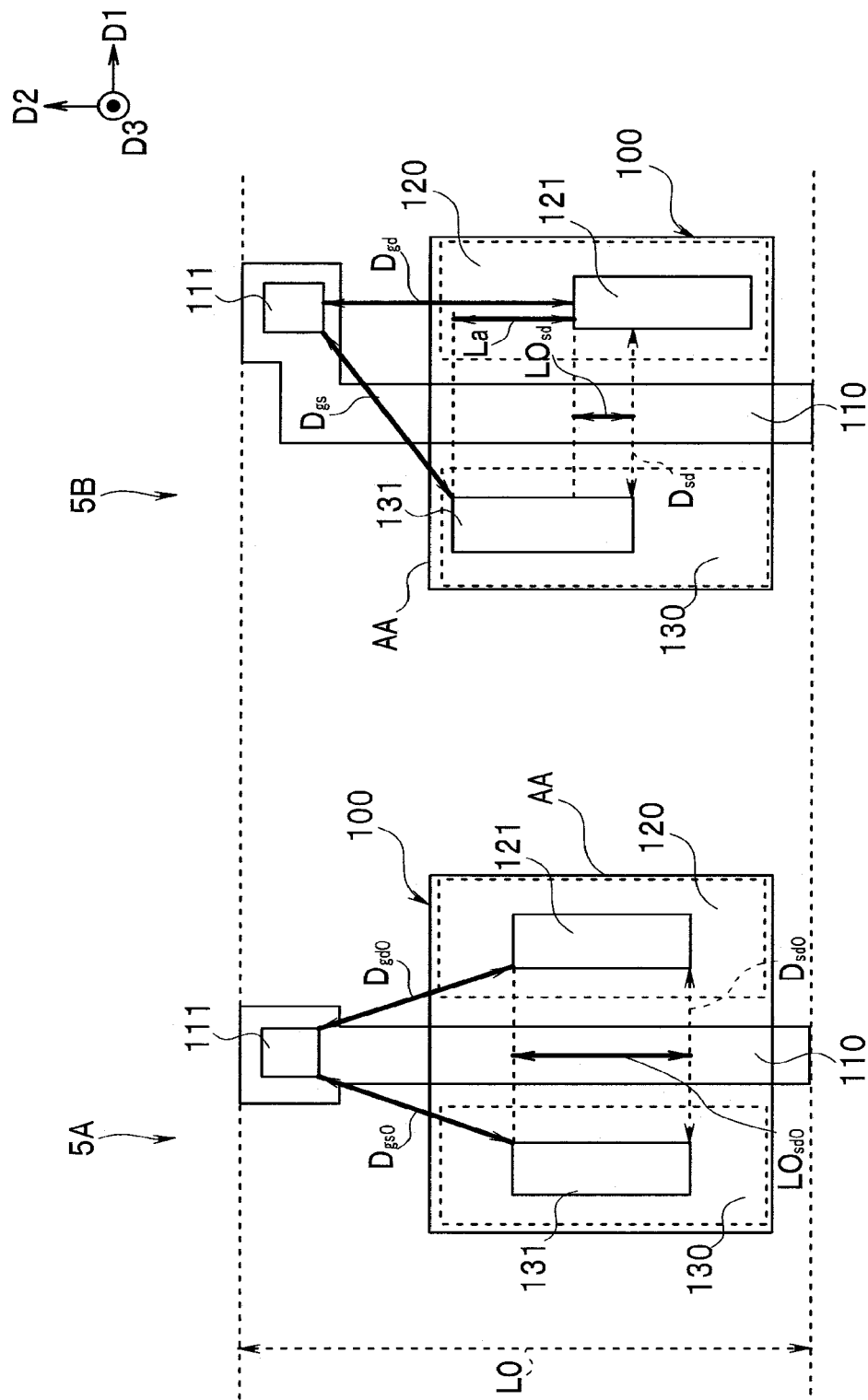
FIG. 5 is a layout diagram of a MOS transistor of the peripheral circuit according to the present embodiment.

FIG. 5 is a layout diagram of the MOS transistor of the peripheral circuit according to the present embodiment. In other words, FIG. 5 shows a plan layout of the MOS transistor when viewed from above in the D3 direction.

In order to show the plan layout of the MOS transistor in the following description, a length of the region in the D1 direction may be referred to as "width" or "length", and a length in the D2 direction may be referred to as "length" or "width". A length in D3 direction may be referred to as "thickness". Further, for example, the D1 direction corresponds to a gate length direction in the MOS transistor, the D2 direction corresponds to a gate width direction in the MOS transistor, and the D3 direction corresponds to a gate-oxide-film thickness direction in the MOS transistor.

In the description of the layout of the MOS transistor according to the present embodiment, first, a layout 5A of a MOS transistor according to a comparative example will be described. A MOS transistor 100 is formed in an active region AA provided on a semiconductor substrate. A drain region 120 and a source region 130 are provided in the active region AA. A gate wiring 110 is disposed between the drain region 120 and the source region 130 so as to extend in the D2 direction. The gate wiring 110 is provided at least in the active region AA on the semiconductor substrate, via a gate insulating film.

A gate electrode 111 serving as a contact region is provided on the gate wiring 110. The gate electrode having a rectangular shape has a first length in the D1 direction and a second length in the D2 direction. A contact plug 112 having a third length in the D3 direction is provided on the gate electrode 111. The third length corresponds to a distance from the gate electrode 111 to the metal wiring 131.

A drain electrode 121 serving as a contact region is provided on the drain region 120. The drain electrode 121 having a rectangular shape has a fourth length in the D1 direction and a fifth length in the D2 direction. A contact plug 122 having a sixth length in the D3 direction is provided on the drain electrode 121. The sixth length corresponds to a distance from the drain electrode 121 to the metal wiring 132.

A source electrode 131 serving as a contact region is provided on the source region 130. The source electrode 131 having a rectangular shape has a seventh length in the D1 direction and an eighth length in the D2 direction. A contact plug 132 having a ninth length in the D3 direction is provided on the source electrode 131. The ninth length corresponds to a distance from the source electrode 131 to the metal wiring 133.

The drain electrode 121 and the source electrode 131 are disposed so as to face each other with the gate wiring 110 interposed between the drain electrode 121 and the source electrode 131 Further, a line connecting a center of the drain electrode 121 and a center of the source electrode 131 is parallel to the D1 direction. For example, when the length (the fifth length) of the drain electrode 121 in the D2 direction is equal to the length (the eighth length) of the source electrode 131 in the D2 direction, one end of the drain electrode 121 in the D2 direction and one end of the source electrode 131 in the D2 direction are located on a straight line parallel to the D1 direction. In addition, the other end of the drain electrode 121 in the D2 direction and the other end of the source electrode 131 in the D2 direction are located on a straight line parallel to the D1 direction. Accordingly, when viewed in the D1 direction, the drain electrode 121 entirely overlaps with the source electrode 131. In other words, a length LOsd0 in the D2 direction of the region where the drain electrode 121 overlaps with the source electrode 131 is equal to the fifth length of the drain electrode 121 in the D2 direction and the eighth length of the source electrode 131 in the D2 direction (LOsd0=fifth length=eighth length).

The gate electrode 111 is disposed on the gate wiring 110 at a position closer to one end in the D2 direction than the active region AA (outside the active region AA when viewed in the D3 direction). In other words, the gate electrode 111 is disposed such that a center of the gate electrode 111 overlaps with a center line of the gate wiring 110 extending between the drain electrode 121 and the source electrode 131 in the D2 direction.

Parasitic capacitance exists between the contact plug 112 connected to the gate electrode 111 and the contact plug 122 connected to the drain electrode 121, between the contact plug 112 connected to the gate electrode 111 and the contact plug 132 connected to the source electrode, and between the contact plug 122 connected to the drain electrode 121 and the contact plug 132 connected to the source electrode. Regarding the parasitic capacitance, the shorter the distance between the wirings facing each other is, the larger the parasitic capacitance is. In addition, the larger the area between the wirings facing each other is, the larger the parasitic capacitance is.

The contact plug 112 is formed so as to reach the gate electrode 111 from the wiring layer ML1 by penetrating through the insulating film formed between the gate wiring 110 and the wiring layer ML1. Similarly, the contact plug 122 or 132 is also formed so as to reach the drain electrode 121 or the source electrode 131 by penetrating through the insulating film formed between the drain region 120 or the source region 130 and the wiring layer ML1 Here, since the wiring layer ML1 is formed above the NAND string NS, a thickness of the insulating layer is equal to or longer than the length of the NAND string NS in the D3 direction. Therefore, each of the third length, the sixth length, and the ninth length of the contact plugs 112, 122, and 132 in the D3 direction is equal to or longer than the length of the NAND string NS in the D3 direction.

As described above, when the lengths of the contact plugs 112, 122, and 132 in the D3 direction are large, the area between the contact plugs facing each other becomes large, and thus the parasitic capacitance becomes large. When the parasitic capacitance becomes large, there is a problem that deterioration in an operation speed due to a circuit delay and deterioration in operation performance such as an erroneous operation due to noise occur. Since the MOS transistor formed in the peripheral circuit is required to operate at high speed, it is, in particular, necessary to avoid deterioration in the operation speed due to the circuit delay.

Therefore, the distance between the contact plugs in the MOS transistor of the present embodiment is made larger than the distance between the contact plugs in the comparative example to reduce the parasitic capacitance and improve the operation performance. A layout 5B of the MOS transistor of the present embodiment will be described. The layout 5B of the MOS transistor of the present embodiment is different from the layout 5A of the MOS transistor of the comparative example in terms of the arrangement of the gate electrode 111, the drain electrode 121, and the source electrode 131 and the shape of the gate wiring 110.

In the MOS transistor 100 of the present embodiment, the drain electrode 121 and the source electrode 131 are disposed such that a line connecting the center of the drain electrode 121 and the center of the source electrode 131 has a predetermined angle with respect to the D1 direction. The other end of the drain electrode 121 in the D2 direction is located closer to the other end in the D2 direction than the other end of the source electrode 131 in the D2 direction. In addition, one end of the drain electrode 121 in the D2 direction is located closer to one end in the D2 direction than one end of the source electrode 131 in the D2 direction. In other words, the drain electrode 121 and the source electrode 131 are disposed so as to be displaced by a predetermined distance La in the D2 direction. In this case, when viewed in the D1 direction, the drain electrode 121 partially overlaps with the source electrode 131. In other words, a length LOsd in the D2 direction of the region where the drain electrode 121 overlaps with the source electrode 131 is smaller than the fifth length of the drain electrode 121 in the D2 direction and the eighth length of the source electrode 131 in the D2 direction (LOsd<fifth length, eighth length).

As described above, when the drain electrode 121 and the source electrode 131 are disposed so as to be displaced from each other in the D2 direction, it is possible to reduce an overlapping area of facing surfaces of the contact plug 122 and the contact plug 123 that are regions having the greatest influence on parasitic capacitance between the wirings.

Therefore, the parasitic capacitance between the wirings can be reduced. In addition, since a distance Dsd between the drain electrode 121 and the source electrode 131 is equal to a distance Dsd0 between the drain electrode 121 and the source electrode 131 of the MOS transistor of the comparative example, it is possible to reduce the parasitic capacitance without increasing the chip area.

In the MOS transistor 100 of the present embodiment, the gate wiring 110 includes a straight line portion extending in the D2 direction between the drain region 120 and the source region 130 and a hook-shaped portion bending in the D1 direction so as to be at right angle with respect to the straight line portion at a position closer to one end in the D2 direction than the active region AA (outside the active region AA when viewed in the D3 direction). The gate electrode 111 is disposed on the hook-shaped portion of the gate wiring 110. In other words, a center of the gate electrode 111 is disposed at a position apart by a predetermined distance in the D1 direction from a center line of the portion of the gate wiring 110 extending between the drain electrode 121 and the source electrode 131 in the D2 direction.

The hook-shaped portion is formed in such a manner that the gate wiring 110 bends in the D1 direction toward one, which is larger displaced toward one end in the D2 direction, of the drain electrode 121 and the source electrode 131. In the structure of the layout 5B, since the drain electrode 121 is disposed on the other end side so as to be displaced from the source electrode 131 in the D2 direction, the gate wiring 110 bends toward the drain electrode 121 (one end side) in the D1 direction, thereby the hook-shaped portion is formed.

In other words, as compared with the comparative example, since the gate electrode 111 is moved to one end side in the D1 direction, that is, toward the drain electrode 121, a distance Dgs between the gate electrode 111 and the source electrode 131 can be made larger than the distance Dgs0 between the gate electrode 111 and the source electrode 131 of the comparative example. In the present embodiment shown in the layout 5B, the gate electrode 111 is closer to one end side (to the drain electrode 121) in the D1 direction as compared with the comparative example shown in the layout 5A, but the drain electrode 121 itself is displaced to the other end side (the side opposite to the gate electrode 111) in the D2 direction. Therefore, a distance Dgd between the gate electrode 111 and the drain electrode 121 in the present embodiment shown in the layout 5B can be made larger than a distance Dgd0 in the comparative example shown in the layout 5A.

In this way, the hook-shaped portion bending in the D1 direction is provided at one side end of the gate wiring 110, and the gate electrode 111 is disposed on the hook-shaped portion. At this time, the distance between the gate electrode 111 and the drain electrode 121 and the distance between the gate electrode 111 and the source electrode 131 can be increased by bending the gate wiring 110 toward the electrode, which is farther from the bending point in the D2 direction, of the drain electrode 121 and the source electrode 131. Therefore, it is possible to reduce the parasitic capacitance between the wirings (between the contact plugs) formed on these electrodes. In addition, a length LO of the gate wiring 110 in the D2 direction in the present embodiment shown in the layout 5B is not different from a length of the gate wiring 110 in the D2 direction in the comparative example shown in the layout 5A. In other words, even when the MOS transistor is formed as in the present embodiment shown in the layout 5B, a chip area does not increase in the D2 direction as compared with the case where the MOS transistor is formed as in the comparative example shown in the layout 5A. Accordingly, it is possible to reduce the parasitic capacitance without increasing the chip area.

As described above, according to the present embodiment, since the drain electrode 121 and the source electrode 131 are disposed so as to be displaced by a predetermined distance in the D2 direction, it is possible to increase the facing distance between the contact plug 122 and the contact plug 123 and/or to reduce the area. In addition, the hook-shaped portion bending in the D1 direction is provided near one end of the gate wiring 110, and the gate electrode 111 is disposed on the hook-shaped portion. Since the gate wiring 110 bends toward the electrode, which is farther from the bending point, of the drain electrode 121 and the source electrode 131, the distance between the gate electrode 111 and the drain electrode 121 and the distance between the gate electrode 111 and the source electrode 131 can be made larger. Accordingly, it is possible to reduce the parasitic capacitance between the wirings without increasing the chip area and to improve operation performance.

Figure 6:
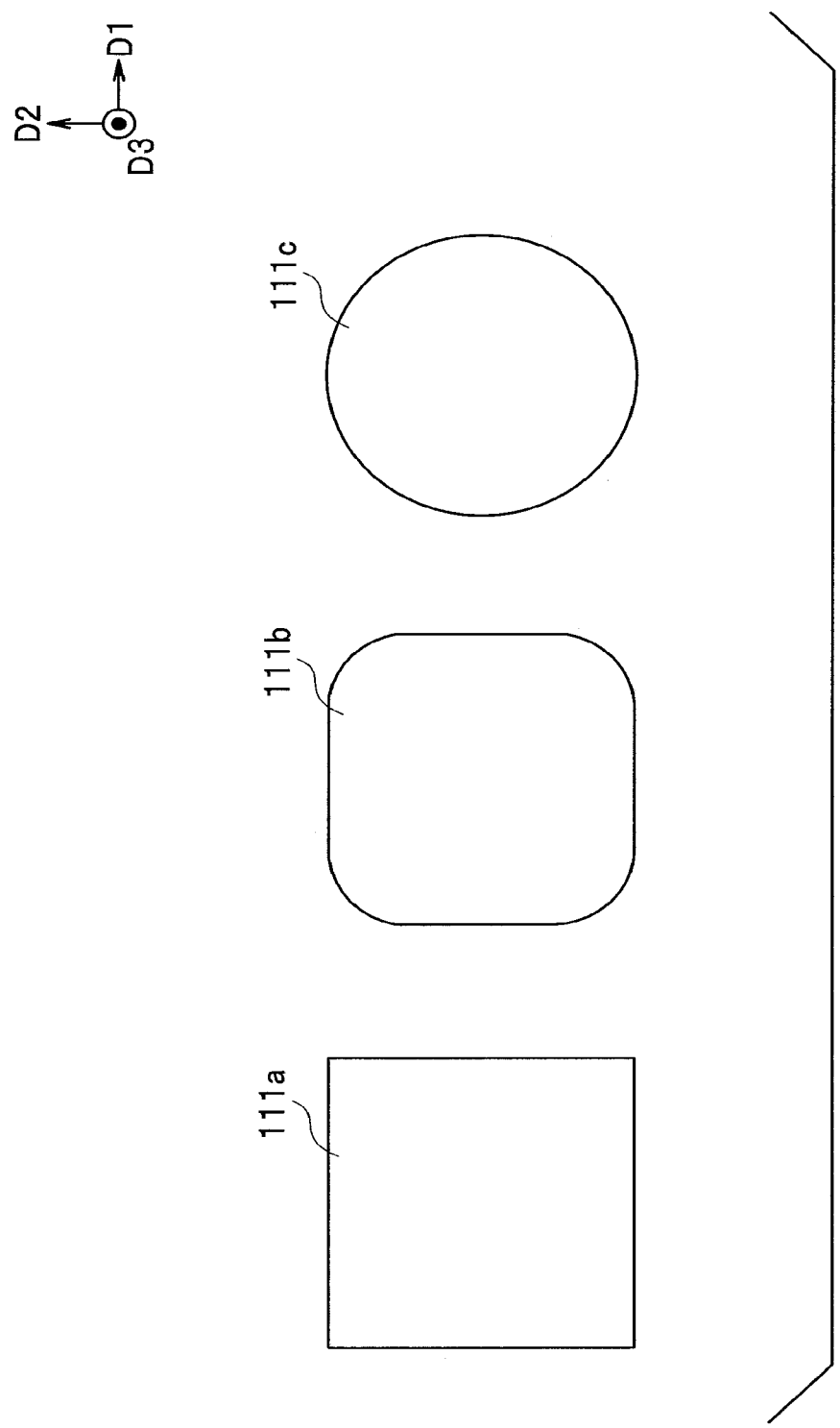
FIG. 6 is a schematic plan view illustrating shapes of contact holes.

FIG. 6 is a schematic plan view illustrating shapes of contact holes. In the layout 5B, a shape of a contact hole formed by penetrating through the insulating film to form the contact plug is shown as a rectangular shape as indicated by a shape 111a. The shapes of the gate electrode 111, the drain electrode 121, and the source electrode 131 located at the bottom of the contact hole are also described as being rectangular. However, the contact hole may be formed in a rectangular shape with rounded corners as indicated by a shape 111b or a circular shape as indicated by a shape 111c due to restrictions in the manufacturing process or manufacturing variations. Also in the present embodiment, the contact hole may have the shapes as indicated by the shapes 111b and 111c, and thus the gate electrode 111, the drain electrode 121, and the source electrode 131 may have the shapes as indicated by the shapes 111b and 111c.

The MOS transistor may be a PMOS transistor. In the layout 5B, the example is described in which the drain region 120 is formed on one end side of the gate wiring 110 in the D1 direction and the source region 130 is formed on the other end side in the D1 direction, but the drain region 120 may be formed on the other end side of the gate wiring 110 in the D1 direction and the source region 130 may be formed on one end side in the D1 direction.

For example, when the parasitic capacitance generated between the contact plug 122 and the contact plug 132 is the largest among the parasitic capacitances between the contact plugs 112, 122, and 132, reduction of such parasitic capacitance is important to improve the operation performance. In such a case, the end of the gate wiring 110 does not necessarily have to be bent, and the effect of reducing the parasitic capacitance can be obtained only by increasing the facing distance between the drain electrode 121 and the source electrode 131 in the D1 direction and/or reducing the area.

Figure 7:
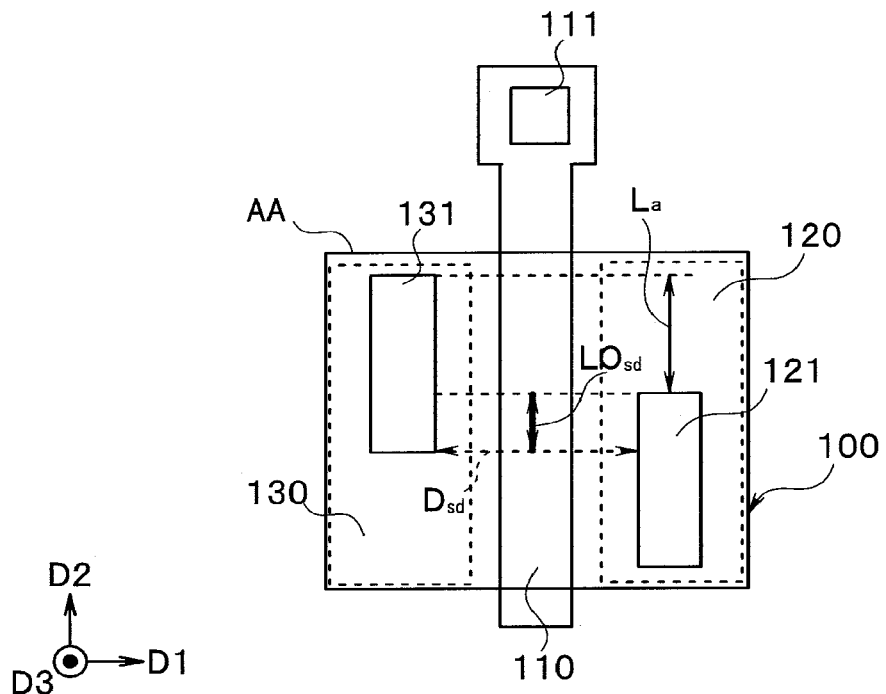
FIG. 7 is another layout diagram of the MOS transistor of the peripheral circuit according to the present embodiment.

FIG. 7 is another layout diagram of the MOS transistor of the peripheral circuit according to the present embodiment. As shown in FIG. 7, the gate electrode 111 may be disposed such that a center of the gate electrode 111 overlaps with a center line of a portion extending between the drain electrode 121 and the source electrode 131 in the D2 direction. Since the drain electrode 121 is disposed on the other end side so as to be displaced from the source electrode 131 by a distance La in the D2 direction, a length LOsd in the D2 direction of the region where the drain electrode 121 overlaps with the source electrode 131 in the D1 direction is shortened, and the parasitic capacitance between the contact plug 122 and the contact plug 132 is reduced.

(2-2. Layout of Plurality of MOS Transistors)

Figure 8:
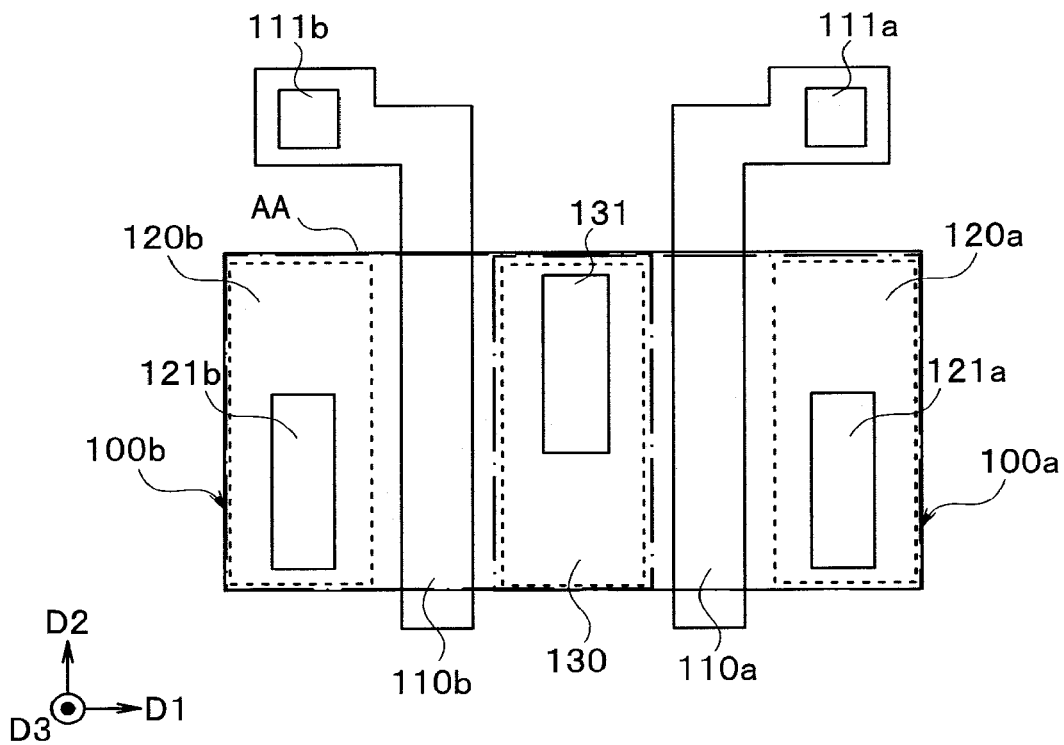
FIG. 8 is yet another layout diagram of the MOS transistor of the peripheral circuit according to the present embodiment.

FIG. 8 is yet another layout diagram of the MOS transistor of the peripheral circuit according to the present embodiment. FIG. 8 shows a case where two MOS transistors 100a and 100b are disposed in an active region AA. The MOS transistor 100a is configured by a drain region 120a, a source region 130, and a gate wiring 110a. The MOS transistor 100b is configured by a drain region 120b, the source region 130, and a gate wiring 110b. The source region 130 is shared by the MOS transistors 100a and 100b. In other words, the MOS transistor 100a and the MOS transistor 100b are disposed in the same active region AA in the D1 direction, and share the source region 130.

In FIG. 8, the MOS transistor 100a has a layout similar to the layout of the MOS transistor 100 shown in the layout 5B. Specifically, the drain region 120a is provided on one end side in the D1 direction, and the source region 130 is provided on the other end side in the D1 direction. A drain electrode 121a serving as a contact region is provided on the drain region 120a. A source electrode 131 serving as a contact region is provided on the source region 130. The drain electrode 121a is disposed on the other end side so as to be displaced from the source electrode 131 by a predetermined distance in the D2 direction. The gate wiring 110a is disposed between the drain region 120a and the source region 130 so as to extend in the D2 direction. The gate wiring 110a is provided at least in the active region AA on the semiconductor substrate, via a gate insulating film. The gate wiring 110a is provided outside the active region AA when viewed in the D3 direction, and is formed with a hook-shaped portion that is bent at a right angle toward one end side (toward the drain electrode 121a when viewed from the gate wiring 110a) in the D1 direction on the one end side in the D2 direction. A gate electrode 111a serving as a contact region is disposed at the hook-shaped portion (on a tip side from a bending point) of the gate wiring 110a.

On the other hand, in FIG. 8, the MOS transistor 100b has a layout in which the MOS transistor 100 shown in the layout 5B is line-symmetrically inverted. In other words, the MOS transistor 100b has a layout in which the MOS transistor 100 is inverted with a line bisecting gate wiring 110b formed on the active region AA in the D1 direction (a straight line extending in the D2 direction) as an axis of symmetry. Specifically, the source region 130 is provided on one end side in the D1 direction, and the drain region 120b is provided on the other end side in the D1 direction. A drain electrode 121b serving as a contact region is provided on the drain region 120b. A source electrode 131 serving as a contact region is provided on the source region 130. The drain electrode 121b is disposed so as to be displaced from the source electrode 131 on the other end side in the D2 direction by a predetermined distance. The gate wiring 110b is disposed between the drain region 120b and the source region 130 so as to extend in the D2 direction. The gate wiring 110b is provided at least in the active region AA on the semiconductor substrate, via a gate insulating film. The gate wiring 110b is formed with a hook-shaped portion that is bent at a right angle toward the other end side (toward the drain electrode 121b when viewed from the gate wiring 110b) in the D1 direction on the one end side in the D2 direction from the active region AA. A gate electrode 111b serving as a contact region is disposed at the hook-shaped portion (on a tip side from a bending point) of the gate wiring 110b.

As described above, when the two MOS transistors 100a and 100b sharing the source region 130 are formed in the same active region AA, both of the drain electrode 121a of the MOS transistor 100a and the drain electrode 121b of the MOS transistor 100b are disposed so as to be displaced from the source electrode 131 on the other end side in the D2 direction. Therefore, it is possible to reduce an area of the overlapping portion of the facing surfaces of the contact plug 122 formed on the drain electrode 121a and the contact plug 123 formed on the source electrode 131.

The gate wiring 110a of the MOS transistor 100a and the gate wiring 110b of the MOS transistor 100b are formed with the hook-shaped portions, respectively, which are bent at a right angle in the D1 direction on one end side in the D2 direction from the active region AA. The hook-shaped portions of the respective gate wirings 110a and 110b are bent toward the drain regions 120a and 120b of the MOS transistors 100a and 100b including the gate wirings 110a and 110b, respectively. In other words, the gate electrode 111a of the MOS transistor 100a is disposed on the drain electrode 121a side away by a predetermined distance from the center line of the gate wiring 110a extending in the active region AA, and the gate electrode 111b of the MOS transistor 100b is disposed on the drain electrode 121b side away by a predetermined distance from the center line of the gate wiring 110b extending in the active region AA.

Accordingly, the distance between the gate electrode 111a and the drain electrode 121a and the distance between the gate electrode 111a and the source electrode 131 can be made larger in the MOS transistor 100a, and the distance between the gate electrode 111b and the drain electrode 121b and the distance between the gate electrode 111b and the source electrode 131 can be made larger in the MOS transistor 100b. Accordingly, it is possible to reduce the parasitic capacitance between the wirings without increasing the chip area and to improve the operation performance.

Figure 9:
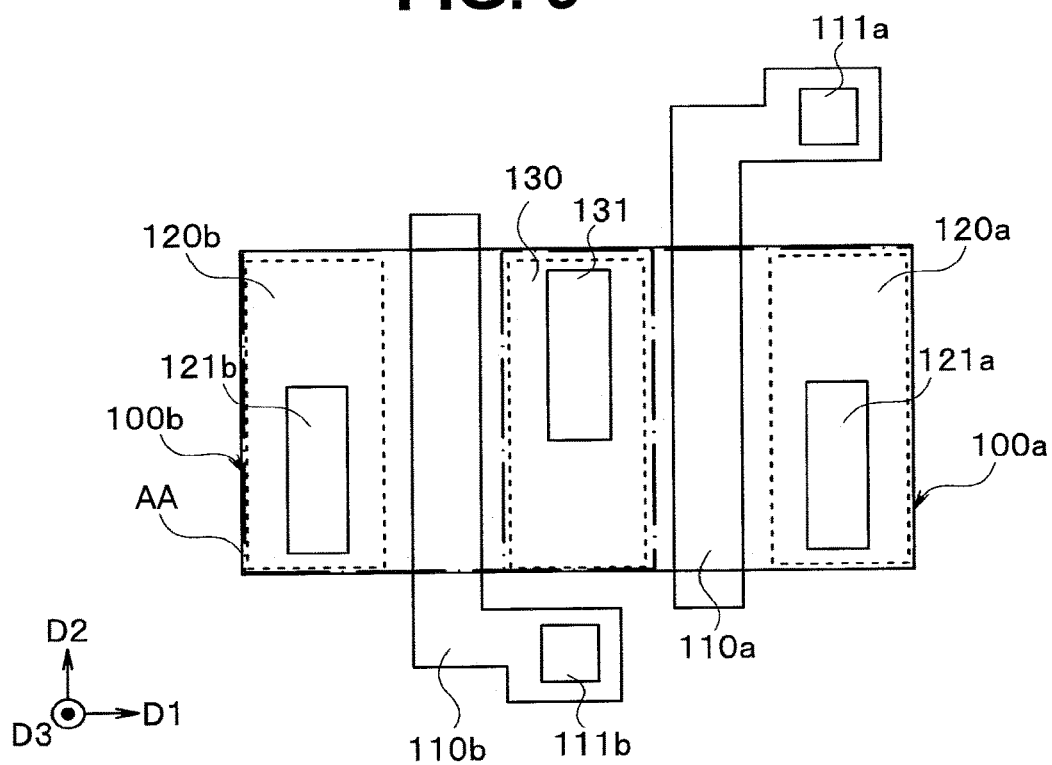
FIG. 9 is still yet another layout diagram of the MOS transistor of the peripheral circuit according to the present embodiment.

In the MOS transistors 100a and 100b described above, both the gate electrodes 111a and 111b are disposed on one end side in the D2 direction from the active region AA, but either of the gate electrodes may be disposed on the other end side in the D2 direction. FIG. 9 is still yet another layout diagram of the MOS transistor of the peripheral circuit according to the present embodiment. FIG. 9 shows another layout in which two MOS transistors 100a and 100b are disposed in an active region AA.

The layout shown in FIG. 9 differs from the layout shown in FIG. 8 in the shape of the gate wiring 110b and the arrangement of the gate electrode 111b. The arrangement of each of the other elements is the same as shown in FIG. 8. The gate electrode 111b is formed with a hook-shaped portion that is bent at a right angle toward one end side (toward the source electrode 131 when viewed from the gate wiring 110b) in the D1 direction on the other end side in the D2 direction from the active region AA. A gate electrode 111b serving as a contact region is disposed at the hook-shaped portion (on a tip side from a bending point) of the gate wiring 110b.

In this way, even when the hook-shaped portion of the gate wiring 110a and the hook-shaped portion of the gate wiring 110b are disposed with the active region AA interposed between the hook-shaped portions in the D2 direction, since in the respective hook-shaped portions the gate wirings 110 are bent such that the tips extend toward the electrode, which is farther from the bending point, of the drain electrode 121 and the source electrode 131, the distance between the gate electrode 111 and the drain electrode 121 and the distance between the gate electrode 111 and the source electrode 131 can be made larger. Accordingly, it is possible to reduce the parasitic capacitance between the wirings without increasing the chip area and to improve operation performance.

Figure 10:
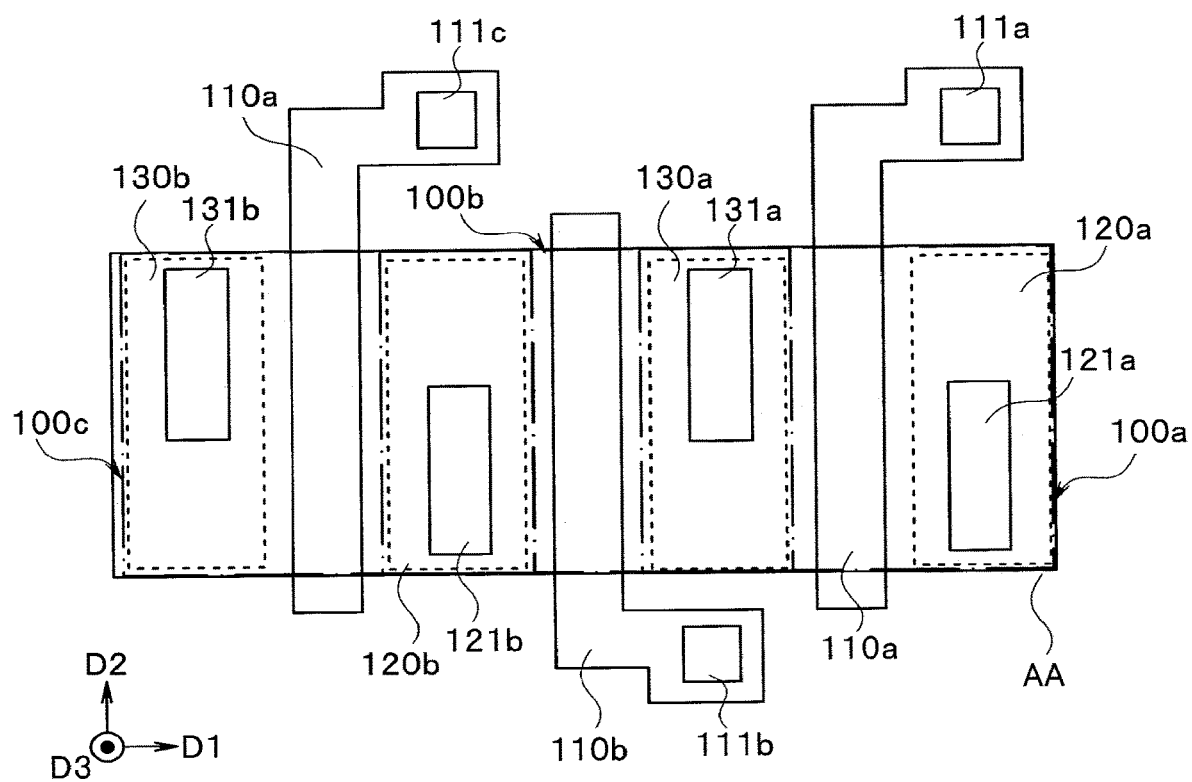
FIG. 10 is still further yet another layout diagram of the MOS transistor of the peripheral circuit according to the present embodiment.

The layout shown in FIG. 9 can be extended and applied even when three or more MOS transistors are formed in the same active region AA. FIG. 10 is still further yet another layout diagram of the MOS transistor of the peripheral circuit according to the present embodiment. FIG. 10 shows a layout in which three MOS transistors 100a, 100b, and 100c are disposed in an active region AA.

In other words, the active region AA is disposed with the MOS transistor 100a including a drain region 120a, a gate wiring 110a, and a source region 130a, the MOS transistor 100b including a source region 130a, a gate wiring 110b, and a drain region 120b, and the MOS transistor 100c including a drain region 120b, a gate wiring 110c, and a source region 130b. The MOS transistors 100a and 100b share the source region 130a, and the MOS transistors 100b and 100c share the drain region 120b.

Since drain electrodes 121a and 121b formed respectively in the drain regions 120a and 120b in the active region AA are disposed on the other end side in the D2 direction so as to be displaced from source electrodes 131a and 131b formed respectively in the source regions 130a and 130b, it is possible to reduce an area of the overlapping portion of the facing surfaces of the contact plug 122 formed on the drain electrode 121 and the contact plug 123 formed on the source electrode 131 in all the MOS transistors 100 formed in the active region AA. Accordingly, it is possible to reduce the parasitic capacitance between the wirings and to improve the operation performance.

Hook-shaped portions respectively provided on the gate wirings 110a, 414b 110b, and 110c are alternately disposed with the active region AA interposed between the wirings in the D2 direction. In other words, the hook-shaped portion of the gate wiring 110a is disposed on one end side in the D2 direction from the active region AA, the hook-shaped portion of the gate wiring 110b is disposed on the other end side in the D2 direction from the active region AA, and the hook-shaped portion of the gate wiring 110c is disposed on one end side in the D2 direction from the active region AA. A bending direction on the tip side at the bending point of each of the gate wirings 110a to 110c is a direction in which the electrode, which is farther from the bending point, of the drain electrode 121 and the source electrode 131 is disposed in the D1 direction. In other words, in the hook-shaped portion located on one end side in the D2 direction from the active region AA, the gate wiring 110 is bent such that the tip extends toward the drain electrode 121 (toward one end side in the D1 direction). In the hook-shaped portion located on the other end side in the D2 direction from the active region AA, the gate wiring 110 is also bent such that the tip extends toward the source electrode 131 (toward one end side in the D1 direction).

With such an arrangement, even when a plurality of MOS transistors 100 are formed in the active region AA, the distance between the gate electrode 111 and the drain electrode 121 and the distance between the gate electrode 111 and the source electrode 131 can be made larger in all the MOS transistors 100. Accordingly, it is possible to reduce the parasitic capacitance between the wirings and to improve the operation performance.

(2-3. Layout of CMOS Transistor)

In the peripheral circuit, a CMOS transistor is frequently used in which an NMOS transistor and a PMOS transistor are combined. For example, an inverter circuit is configured in which gates of the NMOS transistor and the PMOS transistor are connected to each other and are used as an input terminal, drains are connected to each other and are used as an output terminal, a power source voltage Vcc is connected to a source of the PMOS transistor, and a ground voltage Vss is connected to a source of the NMOS transistor.

Figure 11:
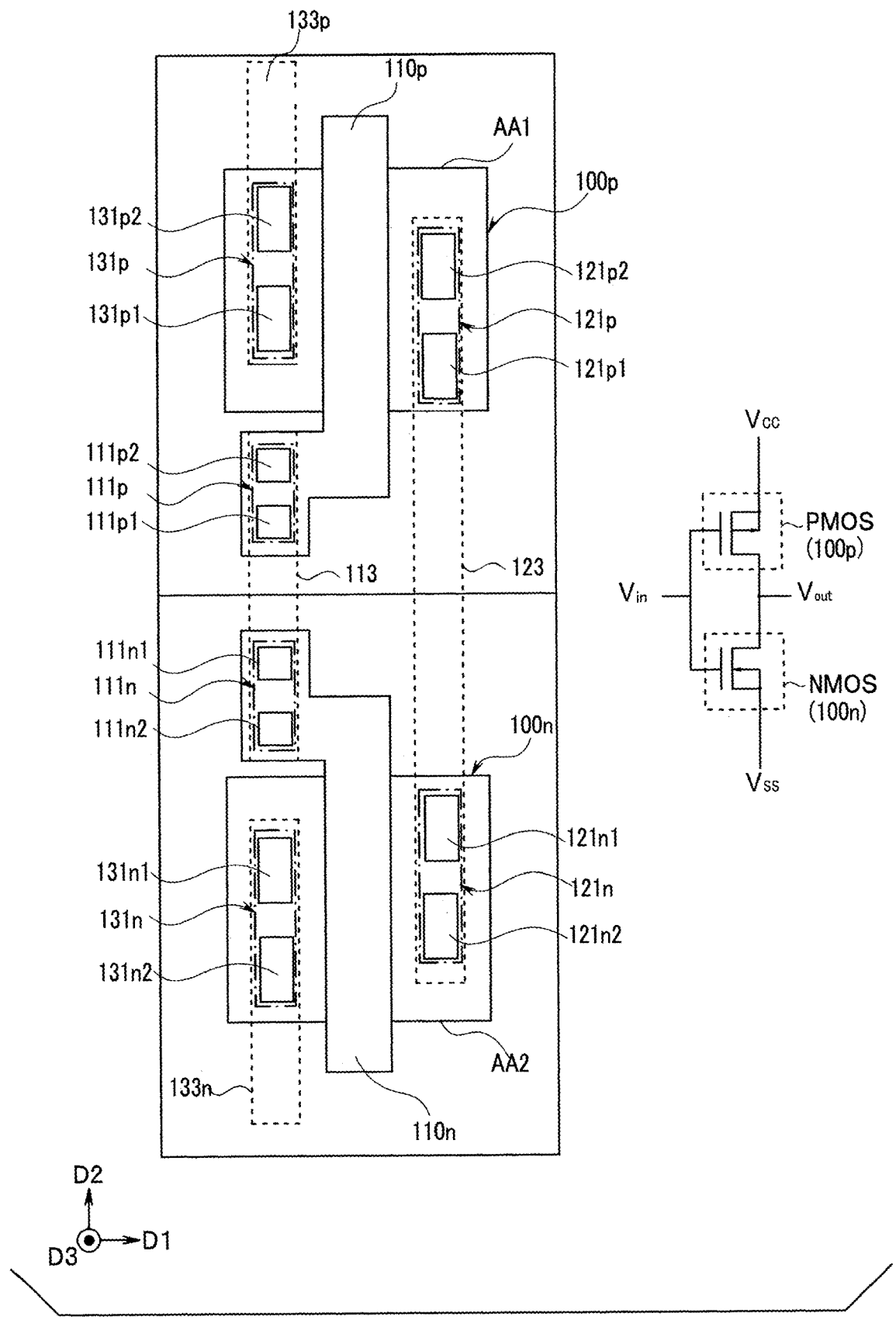
FIG. 11 is a layout diagram of a CMOS transistor of the peripheral circuit according to the present embodiment.

A layout of a CMOS transistor will be described below using an inverter circuit as an example. FIG. 11 is a layout diagram of the CMOS transistor of the peripheral circuit according to the present embodiment. FIG. 11 also shows an equivalent circuit diagram in the layout of the CMOS transistor. A PMOS transistor 100p is formed in an active region AA1 provided on a semiconductor substrate. An NMOS transistor 100n is formed in an active region AA2. The active region AA1 and the active region AA2 are disposed in the D2 direction with an element isolation region (not shown) interposed between the areas.

In the PMOS transistor 100p, a drain region is disposed on one end side in the D1 direction of a gate wiring 110p extending in the D2 direction. A rectangular contact region 121p is provided on the drain region, and two drain electrodes 121p1 and 121p2 are provided in the contact region 121p. The contact region 121p is disposed such that a long side is parallel to the D2 direction and a short side is parallel to the D1 direction. The drain electrodes 121p1 and 121p2 are arranged with a predetermined interval in the D2 direction. A source region is disposed on the other end side in the D1 direction of the gate wiring 110p. A rectangular contact region 131p is provided on the source region, and two source electrodes 131p1 and 131p2 are provided in the contact region 131p. The contact region 131p is disposed such that a long side is parallel to the D2 direction and a short side is parallel to the D1 direction. The source electrodes 131p1 and 131p2 are arranged with a predetermined interval in the D2 direction.

The contact region 121p provided on the drain region is disposed on the other end side so as to be displaced from the contact region 131p provided on the source region by a predetermined distance in the D2 direction. In other words, the contact region 121p and the contact region 131p are disposed on one end side or the other end side in the D2 direction so as to be displaced from each other such that a side on the other end side in the D2 direction of the short sides of the contact region 121p is located below a side on the other end side in the D2 direction of the short sides of the contact region 131p.

The gate wiring 110p is formed with a hook-shaped portion that is bent at a right angle toward the other end side (toward the contact region 131p on the source region when viewed from the gate wiring 110p) in the D1 direction on the other end side in the D2 direction from the active region AA1. A rectangular contact region 111p is provided in the hook-shaped portion (on a tip side from a bending point) of the gate wiring 110p, and two gate electrodes 111p1 and 111p2 are provided in the contact region 111p. The contact region 111p is disposed such that a long side is parallel to the D2 direction and a short side is parallel to the D1 direction. The gate electrodes 111p1 and 111p2 are arranged with a predetermined interval in the D2 direction.

In the NMOS transistor 100n, a drain region is disposed on one end side in the D1 direction of a gate wiring 110n extending in the D2 direction. A rectangular contact region 121n is provided on the drain region, and two drain electrodes 121n1 and 121n2 are provided in the contact region 121n. The contact region 121n is disposed such that a long side is parallel to the D2 direction and a short side is parallel to the D1 direction. The drain electrodes 121n1 and 121n2 are arranged with a predetermined interval in the D2 direction. A source region is disposed on the other end side in the D1 direction of the gate wiring 110n. A rectangular source region 131n is provided on the source region, and two source electrodes 131n1 and 131n2 are provided in the source region 131n. The source region 131n is disposed such that a long side is parallel to the D2 direction and a short side is parallel to the D1 direction. The source electrodes 131n1 and 131n2 are arranged with a predetermined interval in the D2 direction.

The contact region 131n provided on the source region is disposed on the other end side so as to be displaced from the contact region 121n provided on the drain region by a predetermined distance in the D2 direction. In other words, the contact region 121n and the contact region 131n are disposed on one end side or the other end side so as to be displaced from each other such that a side on the other end side in the D2 direction of the short sides of the contact region 131n is located below a side on the other end side in the D2 direction of the short sides of the contact region 121n.

The gate wiring 110n is formed with a hook-shaped portion that is bent at a right angle toward the other end side (toward the contact region 131n on the source region when viewed from the gate wiring 110n) in the D1 direction on one end side in the D2 direction from the active region AA2. A rectangular contact region 111n is provided in the hook-shaped portion (on a tip side from a bending point) of the gate wiring 110n, and two gate electrodes 111n1 and 111n2 are provided in the contact region 111n. The contact region 111n is disposed such that a long side is parallel to the D2 direction and a short side is parallel to the D1 direction. The gate electrodes 111n1 and 111n2 are arranged with a predetermined interval in the D2 direction.

In other words, the NMOS transistor 100n has a layout in which the PMOS transistor 100p is inverted with a straight line bisecting the active region AA1 and the active region AA2 (a straight line extending in the D1 direction) as an axis of symmetry.

A strip-shaped metal wiring 113 extending in the D2 direction is formed above the contact region 111p and the contact region 111n in the D3 direction. A contact plug is formed above the gate electrodes 111p1 and 111p2 in the D3 direction to electrically connect the metal wiring 113 and the contact region 111p. In addition, a contact plug is formed above the gate electrodes 111n1 and 111n2 in the D3 direction to electrically connect the metal wiring 113 and the contact region 111n. In other words, the gate wiring 110p of the PMOS transistor 100p and the gate wiring 110n of the NMOS transistor 100n are electrically connected to the metal wiring 113. The metal wiring 113 is provided with an input terminal that is not shown, and an input voltage Vin is applied from the input terminal.

A strip-shaped metal wiring 123 extending in the D2 direction is formed above the contact region 121p and the contact region 121n in the D3 direction. A contact plug is formed above the drain electrodes 121p1 and 121p2 in the D3 direction to electrically connect the metal wiring 123 and the contact region 121p. In addition, a contact plug is formed above the drain electrodes 121n1 and 121n2 in the D3 direction to electrically connect the metal wiring 123 and the contact region 121n. In other words, the drain region of the PMOS transistor 100p and the drain region of the NMOS transistor 100n are electrically connected to the metal wiring 123. The metal wiring 123 is provided with an output terminal that is not shown, and an output voltage Vout is output from the output terminal.

A strip-shaped metal wiring 133p extending in the D2 direction is formed above the contact region 131p in the D3 direction. A contact plug is formed above the source electrodes 131p1 and 131p2 in the D3 direction to electrically connect the metal wiring 133p and the contact region 131p The metal wiring 133p is provided with a terminal that is not shown, and a power source voltage Vcc is supplied from the terminal to the source region of the PMOS transistor 100p.

A strip-shaped metal wiring 133n extending in the D2 direction is formed above the contact region 131n in the D3 direction. A contact plug is formed above the source electrodes 131n1 and 131n2 in the D3 direction to electrically connect the metal wiring 133n and the contact region 131p. The metal wiring 133n is provided with a terminal that is not shown, and a ground voltage Vss is supplied from the terminal to the source region of the NMOS transistor 100n. The metal wirings 131, 132, 133p, and 133n are formed in a wiring layer ML1.

As described above, also in the CMOS transistor, since the contact region 121 on the drain side and the contact region 131 on the source side are disposed so as to be displaced from each other by a predetermined distance in the D2 direction in both of the PMOS transistor 100p and the NMOS transistor 100n, it is possible to reduce the area of the overlapping portion of the facing surfaces of the contact plug formed on the contact region 121 and the contact plug formed on the contact region 131. The hook-shaped portion is provided near one end of the gate wiring 110 to bend in the D1 direction, and the gate electrode 111 is disposed on the hook-shaped portion. Since the gate wiring 110 bends toward the contact region, which is farther from the bending point, of the contact region 121 and the contact region 131, the distance between the gate electrode 111 and the drain electrode 121 and the distance between the gate electrode 111 and the source electrode 131 can be made larger. Accordingly, it is possible to reduce the parasitic capacitance between the wirings without increasing the chip area and to improve the operation performance.

Although the case is described above in which two electrodes are respectively formed in the contact regions 111, 121, and 131 of the CMOS transistor, the number of electrodes may be one or two or more. In addition, the contact region 111p does not have to be disposed on a straight line that passes through the contact region 131p and is parallel to the D2 direction. The distance from the bending point of the gate wiring 110p to the contact region 111p is determined in consideration of manufacturing restrictions such as design rules and restrictions in required operation performance. The positional relation between the contact region 111n and the contact region 131n is also determined in consideration of such restrictions.

Figure 12:
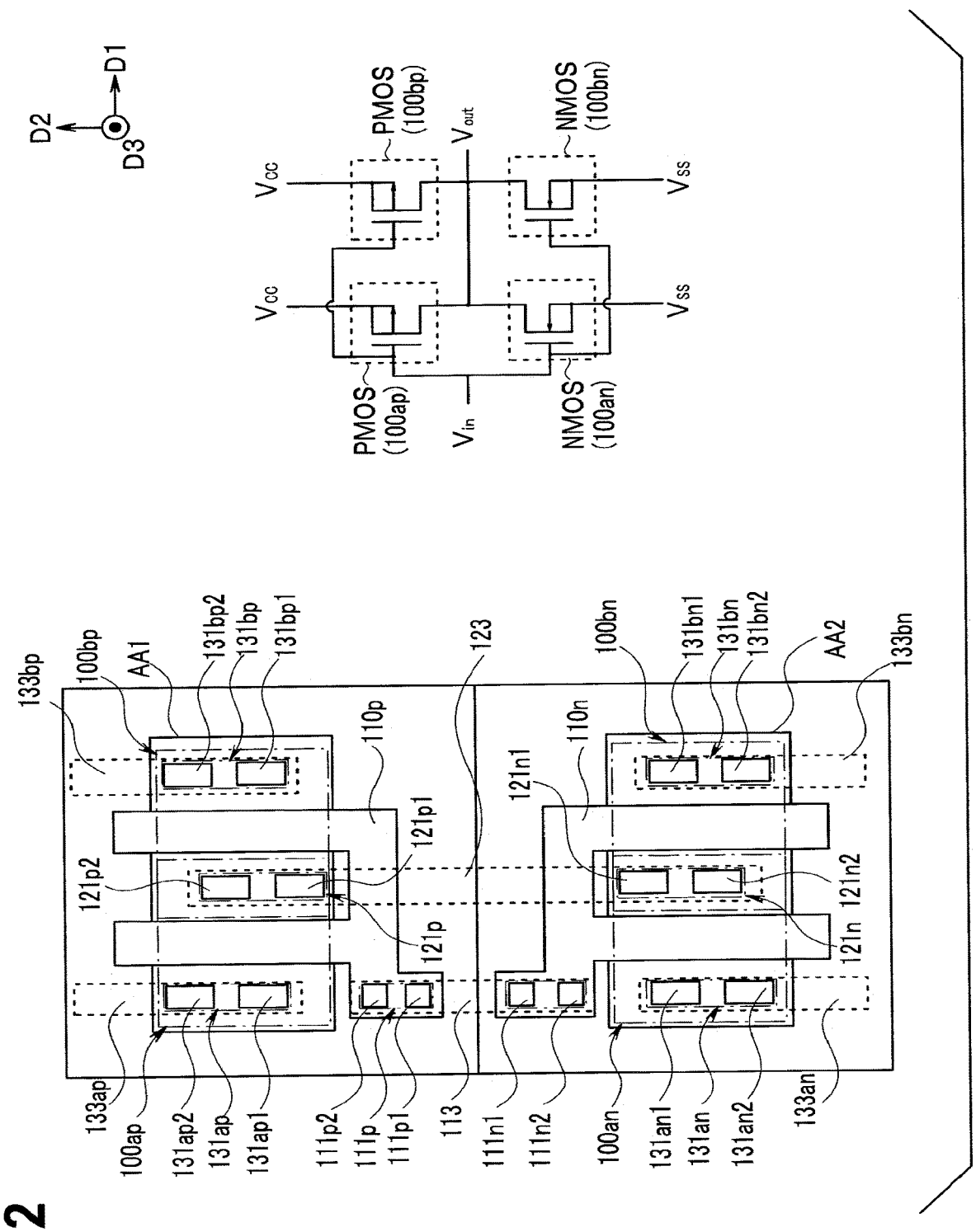
FIG. 12 is yet another layout diagram of a CMOS transistor of the peripheral circuit according to the present embodiment.

FIG. 12 is yet another layout diagram of the CMOS transistor of the peripheral circuit according to the present embodiment. FIG. 12 shows a layout of an inverter circuit in which the CMOS transistors shown in FIG. 11 are connected in parallel and an area is substantially doubled to double driving capability. Even when a plurality of PMOS transistors and a plurality of NMOS transistors are used in this way, the contact region 121 formed on the drain region and the contact region 131 formed on the source region are disposed on one end side or the other end side in the D2 direction so as to be displaced from each other in each of the MOS transistors, and thus it is possible to reduce the area of the overlapping portion of the facing surfaces of the contact plug, formed on the contact region 121 and the contact plug formed on the contact region 131.

The hook-shaped portion is provided near one end of the gate wiring 110 to bend in the D1 direction, and the contact region 111 is disposed on the hook-shaped portion. Since the contact region 131a on the drain side, which is closer to the contact region 111, of the contact region 121 on the source side closest to the contact region 111 and the contact region 131a on the drain side closest to the contact region 111 is disposed so as to be displaced in a direction away from the contact region 111, the distance between the contact region 111 and the contact region 121 and the distance between the contact region 111 and the contact region 131 can be made larger. Accordingly, it is possible to reduce the parasitic capacitance between the wirings without increasing the chip area and to improve the operation performance.

Figure 13:
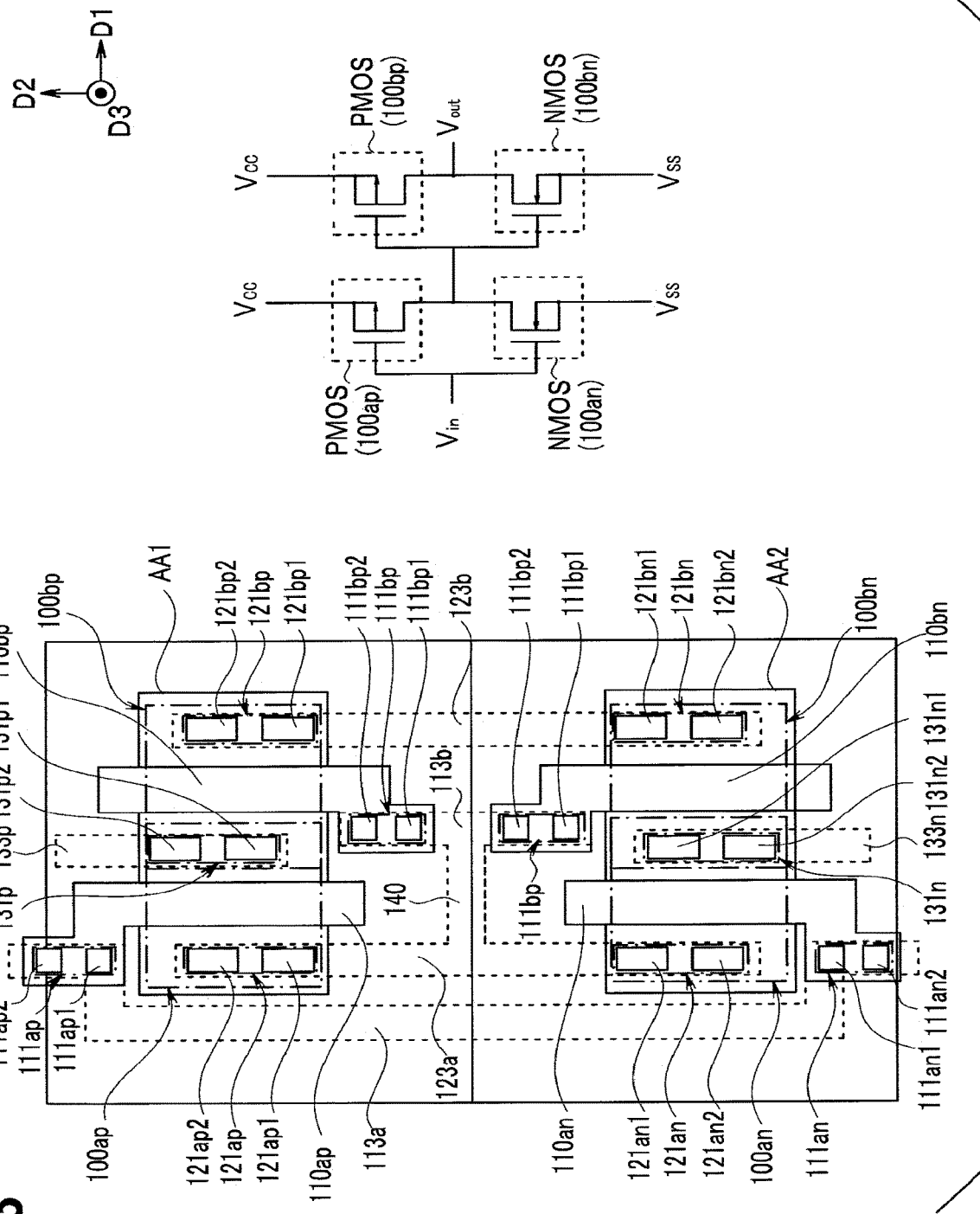
FIG. 13 is still yet another layout diagram of a CMOS transistor of the peripheral circuit according to the present embodiment.

FIG. 13 is still yet another layout diagram of the CMOS transistor of the peripheral circuit according to the present embodiment. FIG. 13 shows a layout of a two-stage connection inverter circuit in which the CMOS transistors shown in FIG. 11 are connected in series. Even when a plurality of PMOS transistors and a plurality of NMOS transistors are used in this way, the contact region 121 formed on the drain region and the contact region 131 formed on the source region are disposed on one end side or the other end side in the D2 direction so as to be displaced from each other in each of the MOS transistors, and thus it is possible to reduce the area of the overlapping portion of the facing surfaces of the contact plug formed on the contact region 121 and the contact plug formed on the contact region 131.

In each of the MOS transistors, even when the hook-shaped portion of the gate wiring 110a and the hook-shaped portion of the gate wiring 110b are disposed with the active region AA interposed between the hook-shaped portions in the D2 direction, since in the respective hook-shaped portions, the gate wirings 110 are bent such that the tips extend toward the electrode, which is farther from the bending point, of the contact region 121 on the drain side and the contact region 131 on the source side, the distance between the contact region 111 and the contact region 121 and the distance between the contact region 111 and the contact region 131 can be made larger. Accordingly, it is possible to reduce the parasitic capacitance between the wirings and to improve the operation performance.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate having a main surface extending in a first direction and a second direction crossing the first direction, the semiconductor substrate including:
a memory region; and
a peripheral circuit region;
a plurality of word lines stacked in a third direction crossing the first direction and the second direction to overlap with the memory region of the semiconductor substrate when viewed in the third direction, each word line extending in the first direction and the second direction;
a semiconductor pillar extending in the third direction through the word lines to reach the semiconductor substrate, each of intersections of the word lines with the semiconductor pillar functioning a memory cell transistor;
a first circuit including a first MOS transistor formed on the main surface of the semiconductor substrate in the peripheral circuit region of the semiconductor substrate, the first MOS transistor including:
a first diffusion layer extending in the second direction,
a second diffusion layer extending in the second direction and disposed apart from the first diffusion layer in the first direction, and,
a gate electrode at least partially extending in the second direction and disposed between the first diffusion layer and the second diffusion layer,
a first wiring disposed at a position higher than an uppermost one of the word lines in the third direction to overlap with the peripheral circuit region of the semiconductor substrate when viewed in the third direction,
a first contact plug extending in the third direction to electrically connect between the first diffusion layer and the first wiring,
a second wiring disposed at the same position in the third direction with the first wiring to overlap with the peripheral circuit region of the semiconductor substrate when viewed in the third direction; and
a second contact plug extending in the third direction to electrically connect between the second diffusion layer and the second wiring,
wherein
when viewed in the third direction, a first contact region, where the first contact plug reaches the first diffusion layer, and a second contact region, where the second contact plug reaches the second diffusion layer, are offset with respect to each other in the second direction,
the gate electrode includes
a main portion extending in the second direction and overlapping the active region when viewed in the third direction,
a bent portion that extends from the main portion to a position not overlapping the active region when viewed in the third direction and bends towards the first contact plug in the first direction, and
a third contact region where a third contact plug reaches the gate electrode is formed on a tip end of the bent portion, and
the first contact plug is offset to be further away from the third contact region in the second direction than the second contact plug.

2. The semiconductor memory device according to claim 1, further comprising:
a third wiring disposed at the same position in the third direction with the first wiring to overlap with the peripheral circuit region of the semiconductor substrate when viewed in the third direction; and
the third contact plug extending in the third direction to electrically connect between the gate electrode and the third wiring,
wherein
the MOS transistor includes an active region formed in the semiconductor substrate, the first diffusion layer and the second diffusion layer overlapping the active region when viewed in the third directions.

3. The semiconductor memory device according to claim 2, wherein
the first circuit further includes a second MOS transistor arranged with the first MOS transistor in the first direction to share the first diffusion layer, and a bent portion of the gate electrode of the second MOS transistor and the bent portion of the gate electrode of the first MOS transistor are disposed on the same side of the active region in the second direction.

4. The semiconductor memory device according to claim 2, wherein
the first circuit further includes a second MOS transistor arranged with the first MOS transistor in the first direction to share the first diffusion layer, and a bent portion of the gate electrode of the second MOS transistor and the bent portion of the gate electrode of the first MOS transistor are disposed on opposite sides of the active region in the second direction.

5. The semiconductor memory device according to claim 2, wherein
the first circuit further includes a third MOS transistor arranged with the first MOS transistor in the first direction to share the second diffusion layer, and bent portions of the gate wiring of the third MOS transistor and the bent portions of the gate electrode of the first MOS transistor are disposed on opposite sides of the active region in the second direction.

6. The semiconductor memory device according to claim 2, further comprising:
a bit line,
wherein
the memory cells are formed at the intersections of the semiconductor pillar and the word lines are electrically connected in series between the bit line and the semiconductor substrate to form a memory string.

7. The semiconductor memory device according to claim 2, wherein
when viewed in the third direction,
the first contact region is offset toward a first side of the active region in the second direction,
the second contact region is offset toward a second side opposing the first side of the active region in the second direction, and
the third contact region is offset toward a third side of the active region in the first direction which is closer to the first contact region as compared with the second contact region in the first direction.

8. The semiconductor memory device according to claim 7, wherein
when viewed in the second direction,
the third contact region overlaps with the first contact region and does not overlap with the second contact region.

9. The semiconductor memory device according to claim 8, wherein
when viewed in the first direction,
a distance in the second direction in which the first contact region overlaps with the second contact region is smaller than a distance in the second direction in which the first contact region does not overlap with the second contact region.

10. The semiconductor memory device according to claim 2, wherein
when viewed in the third direction,
a distance between the first contact region and the third contact region is larger than a distance between the first contact region and the main portion of the gate electrode, and
a distance between the second contact region and the third contact region is larger than a distance between the second contact region and the main portion of the gate electrode.

11. The semiconductor memory device according to claim 2, wherein
positions of the first to third contact regions are arranged to reduce a parasitic capacitance between the first contact region and the second contact region,
a parasitic capacitance between the second contact region and the third contact region, and
a parasitic capacitance between the third contact region and the first contact region.

12. The semiconductor memory device according to claim 2, further comprising:
a source line wiring disposed at the same position in the third direction with the first wiring to overlap with the memory region of the semiconductor substrate when viewed in the third direction; and
a fourth contact plug extending in the third direction to electrically connect between the source line wiring and the semiconductor substrate.

13. The semiconductor memory device according to claim 12, wherein
each of the first to fourth contact plugs is formed into a columnar shape, and the first to fourth contact plugs have a same length in the third direction.

14. The semiconductor memory device according to claim 1, wherein
each of the first contact plug and the second contact plug is formed in a columnar shape and has a length in the third direction larger than a distance between the uppermost one and a lowermost one of word lines in the third direction.

* * * * *